(12) United States Patent
Sandberg

(10) Patent No.: US 7,963,395 B2
(45) Date of Patent: Jun. 21, 2011

(54) METHOD OF HOLDING TOGETHER PACKAGES AND COMPONENTS THERETO

(75) Inventor: Lars Sandberg, Hammaro (SE)

(73) Assignee: Stora Enso AB, Karlstad (SE)

( * ) Notice: Subject to any disclaimer, the term of this patent is extended or adjusted under 35 U.S.C. 154(b) by 1372 days.

(21) Appl. No.: 11/488,398

(22) Filed: Jul. 18, 2006

(65) Prior Publication Data

US 2007/0023313 A1    Feb. 1, 2007

(51) Int. Cl.
*B65D 73/00* (2006.01)

(52) U.S. Cl. .............. 206/460; 206/813; 428/34.1

(58) Field of Classification Search .......... 206/460, 206/477, 495, 813; 428/34.1; 294/1.1
See application file for complete search history.

(56) References Cited

U.S. PATENT DOCUMENTS

| | | |
|---|---|---|
| 1,198,227 A | 9/1916 | Hinchey |
| 1,553,146 A | 9/1925 | Dinsmoor |
| 1,679,467 A | 8/1928 | Dinsmoor |
| 2,522,961 A | 9/1950 | Rabak |
| 2,744,655 A | 5/1956 | Vnuk |
| 3,129,817 A | 4/1964 | Rohdin |
| 3,348,640 A | 10/1967 | Thompson et al. |
| 3,548,140 A | 12/1970 | O'Neill |
| 3,551,963 A | 1/1971 | Mosher |
| 3,621,989 A | 11/1971 | Pregont |
| 3,629,092 A | 12/1971 | George |
| 3,679,534 A | 7/1972 | Weinberg |
| 3,899,117 A | 8/1975 | Peyser et al. |
| 3,916,756 A | 11/1975 | Yoda |
| 3,968,823 A | 7/1976 | Simon |
| 4,110,506 A | 8/1978 | Cottingham et al. |
| 4,125,684 A | 11/1978 | Land |
| 4,197,947 A | 4/1980 | Zaidi |
| 4,333,569 A | 6/1982 | Hammacher |
| 4,436,206 A | 3/1984 | Kuchenbecker |
| 4,448,345 A | 5/1984 | Helms |
| 4,525,233 A * | 6/1985 | Brooks ............... 156/273.9 |
| 4,539,275 A | 9/1985 | Plasse |
| 4,586,624 A | 5/1986 | Shaw |
| 4,599,273 A | 7/1986 | Eian et al. |
| 4,669,610 A | 6/1987 | Lindsey et al. |
| 4,721,543 A | 1/1988 | Wolfson |
| 4,743,320 A | 5/1988 | Shaw |

(Continued)

FOREIGN PATENT DOCUMENTS

DE    1432090    12/1968

(Continued)

OTHER PUBLICATIONS

Electronic Smart Packaging: Market Research Report; Published by: IDTechEx Ltd., Published Jul. 1, 2004, pp. 78-79.

(Continued)

*Primary Examiner* — Jacob K Ackun, Jr.
(74) *Attorney, Agent, or Firm* — Greer, Burns & Crain, Ltd.

(57) ABSTRACT

The disclosure relates to a connecting element adapted to temporarily holding together a plurality of articles, the connecting element comprising a base member provided with a first adhesion area adapted to hold a first secondary article to said base member and a second adhesion area adapted to hold a second secondary article to said base member, wherein the adhesion areas comprise an electrically weakable adhesive. Also disclosed is a package and an article being provided with adhesion areas comprising an electrically weakable adhesive.

19 Claims, 8 Drawing Sheets

U.S. PATENT DOCUMENTS

| | | | |
|---|---|---|---|
| 4,859,263 | A | 8/1989 | Dziurla et al. |
| 4,882,399 | A | 11/1989 | Tesoro et al. |
| 4,947,527 | A | 8/1990 | Hennig |
| 5,090,570 | A | 2/1992 | Todd |
| 5,100,494 | A | 3/1992 | Schmidt |
| 5,102,753 | A | 4/1992 | Rossoll et al. |
| 5,178,277 | A | 1/1993 | Brown et al. |
| 5,226,809 | A | 7/1993 | Franco |
| 5,244,092 | A | 9/1993 | Karita et al. |
| 5,252,413 | A * | 10/1993 | Alamgir et al. ............... 429/316 |
| 5,275,856 | A * | 1/1994 | Calhoun et al. .............. 428/41.1 |
| 5,289,785 | A | 3/1994 | MacPherson et al. |
| 5,412,918 | A | 5/1995 | Wendel et al. |
| 5,477,009 | A | 12/1995 | Brendecke et al. |
| 5,534,663 | A | 7/1996 | Rivers et al. |
| 5,582,884 | A | 12/1996 | Ball et al. |
| 5,656,081 | A | 8/1997 | Isen et al. |
| 5,680,744 | A | 10/1997 | Kramedjian et al. |
| 5,763,058 | A | 6/1998 | Isen et al. |
| 5,865,940 | A * | 2/1999 | Li ............................. 156/379.6 |
| 5,976,955 | A | 11/1999 | Hodges |
| 6,050,622 | A | 4/2000 | Gustafson |
| 6,098,800 | A | 8/2000 | Bennish, Jr. et al. |
| 6,116,501 | A | 9/2000 | Hupp |
| 6,336,567 | B1 | 1/2002 | Hyobu |
| 6,508,375 | B1 | 1/2003 | Krall |
| 6,620,308 | B2 * | 9/2003 | Gilbert ......................... 205/702 |
| 6,680,097 | B1 | 1/2004 | Amberger et al. |
| 6,838,617 | B2 | 1/2005 | Shaw et al. |
| 6,846,449 | B2 | 1/2005 | Martin et al. |
| 7,332,218 | B1 | 2/2008 | Gilbert |
| 7,465,492 | B2 | 12/2008 | Gilbert |
| 7,736,710 | B2 * | 6/2010 | Sandberg ..................... 428/34.1 |
| 2001/0031367 | A1 | 10/2001 | Gilbert |
| 2003/0217937 | A1 | 11/2003 | Wilder et al. |
| 2004/0028847 | A1 * | 2/2004 | Teague et al. ................ 428/34.1 |
| 2004/0057638 | A1 | 3/2004 | Perell et al. |
| 2004/0074071 | A1 * | 4/2004 | Golden et al. ................... 24/442 |
| 2004/0234719 | A1 * | 11/2004 | Jones ................................ 428/62 |
| 2005/0109249 | A1 | 5/2005 | Shen et al. |
| 2005/0159184 | A1 | 7/2005 | Kerner et al. |
| 2005/0212304 | A1 | 9/2005 | Herrera et al. |
| 2006/0027320 | A1 | 2/2006 | Kueppers et al. |
| 2007/0023382 | A1 * | 2/2007 | Sandberg ....................... 215/232 |
| 2007/0023884 | A1 * | 2/2007 | Branzell et al. ............... 257/679 |
| 2007/0054082 | A1 * | 3/2007 | Beyer et al. ..................... 428/43 |
| 2008/0115460 | A1 * | 5/2008 | Ruid et al. ....................... 53/428 |
| 2008/0196828 | A1 | 8/2008 | Gilbert |
| 2008/0283415 | A1 | 11/2008 | Gilbert |
| 2009/0032293 | A1 * | 2/2009 | Miyakawa et al. ........... 174/257 |

FOREIGN PATENT DOCUMENTS

| | | |
|---|---|---|
| DE | 3030290 | 4/1982 |
| DE | 3325383 | 3/1985 |
| EP | 0408900 | 1/1991 |
| GB | 2170470 | 8/1986 |
| WO | WO 9306992 | 4/1993 |
| WO | WO 2006 050340 | 5/2006 |

OTHER PUBLICATIONS

Novel Adhesive Debonds Electrically; Dec. 2000, www.plasticstechnology.com.

International Search Report from PCT/SE2006/050261.
International Search Report from PCT/SE2006/050262.
International Search Report from PCT/SE2006/050263.
International Search Report from PCT/SE2006/050264.
International Search Report from PCT/SE2006/050265.

G.S. Shapoval, Cathodic initiation of Reactions of Macromolecule Formation and Degradation, Theoretical and Experimental Chemistry, vol. 30, No. 6, Nov. 1994.

Linden, D.; Reddy, T.B. (2002). Handbook of Batteries (3rd Edition). McGraw-Hill.

* cited by examiner

METHOD OF HOLDING TOGETHER PACKAGES AND COMPONENTS THERETO

FIELD OF INVENTION

The invention relates to a new kind of distribution solution. The invention may e.g. be used as an integral part of a distribution package, as a supplement to a distribution package, or even as a substitute for a distribution package.

TECHNICAL BACKGROUND

The old way of distributing products in large distribution packages, followed by repacking of the products behind the store counter in paper bags, or the like, in the amount as bought by the consumer, has almost completely disappeared. Decades ago the wide spread of the large self service stores, with pre-packed products stored on shelves, from which the consumers themselves pick the products, lead to great developments in the packaging industry.

Today almost all consumer products are packed at the manufacturing or processing site, distributed, sold, and often also stored in the consumers' home, in one and the same package. One popular kind of package used for almost all kind of products is a box made of paperboard. Paperboard boxes are, e.g., widely used for dry food products and for small commodity items such as screws and nails. By providing an inner bag the paperboard box may also be used for liquids or for powder products, such as cocoa and dry milk. The paperboard box may also be made liquid tight by laminating the paperboard with a plastic material.

The paperboard box is also often used as an outer packaging, such as the outer box housing the foil-covered paper plate of microwavable heat-and-eat meals and the outer box housing perfume bottles or the like.

Other kinds of consumer packages are plastic bottles, glass bottles, plastic boxes, metal cans, glass jars, etc.

Common for all kinds of consumer packages is that they contain a consumer adapted volumes or amounts of the product in question. This gives that the volume of each of the consumer packages is relatively small compared to the total volume sold by each store and even smaller compared to the total volume distributed to a number of stores in the same distribution area. It is not practical for the store or distribution personnel to handle every single consumer package one by one. This is one major reason for the wide spread use of distribution packages housing several consumer packages.

One commonly used distribution package is a corrugated cardboard box enclosing the consumer packages. The corrugated cardboard is usually folded to form an open ended box, filled with the consumer packages and closed by gluing together two or more flaps. In automatic processes it is also common to gather several consumer packages side by side and then the corrugated cardboard box is formed by basically wrapping the cardboard about the consumer packages and finally close it by gluing together one or more flaps. Cardboard boxes are usually opened by either cutting the cardboard using a knife, tearing the glued flaps open by hand, or tearing the cardboard along perforations by hand. Using a knife introduces the risk of personnel injuries or damages to the consumer packages. In order to avoid handling the consumer packages one by one, it is often also desirable to be able to keep a part of the distribution package as a bottom tray or the like, making it possible to put several consumer packages onto the shelf in one heave. Such a package is usually designed to be opened by a tearing action. However, the cardboard box is often torn apart instead of simply torn open, when the store personnel tears the glued flap open or tears the cardboard along any perforation. This is not satisfactory since it will give an impression of low quality reflecting negatively on the product and the store. Since the tray usually need to be provided with a rim, i.e. a lower portion of the side walls need to be left, in order to provide the necessary stability, it is difficult to open such a distribution package using a knife without damaging the consumer packages. The cardboard box may alternatively be closed using interlocking flaps. However, it is often hard to accomplish an automatic closing of such a box. Moreover, the flaps often need to be removed by a tearing or cutting action when the box is to be put on the store shelf. Thus, this kind of box is also associated with problems relating to tearing or cutting of the cardboard as discussed above.

A simple and cheap way of providing a distribution package is to plastic film wrapping several consumer packages. This requires however often that the consumer packages as such are relatively form stable. When the consumer packages are to be put on the store shelves, the store personnel cuts the film wrapping open, using a knife, and put the consumer packages one by one on the shelf. The use of a knife introduces the risk of personnel injuries or damages to the consumer packages. Moreover, the store personnel still has to handle the consumer packages one by one. By putting the consumer packages on a tray and then film wrap the tray together with the consumer packages, this one by one handling may be avoid. This kind of distribution package is often used for metal cans, plastic bottles and plastic tubes distributed standing up on the tray. However, the film wrapping still has to be cut open.

Consumer packages and distribution packages have been used wide spread for several decades within almost every line of business but, as has been discussed above, the different kind of distribution packages are all associated with different problems.

It is well known in the art that polymer chains can be broken by the application of a voltage. This is for example discussed in a review article by G. S. Shapoval (Cathodic initiation of reactions of macromolecule formation and degradation, Theoretical and Experimental Chemistry, Volume 30, Number 6, November 1994).

U.S. Pat. No. 6,620,308 B2 discloses a material for use in the airplane industry. As is evident from the published patent, the material has been developed under the supervision of the U.S. Department of the Air Force. The material is developed for use as coatings and adhesives. It is further elaborated in U.S. Pat. No. 6,620,308 that the adhesive bonds and polymeric coatings are commonly used in the assembly and finishing of manufactured goods. It is stated that adhesive bonds are used in place of mechanical fasteners, such as screw, bolts and rivets, to provide bonds with reduced machining costs and greater adaptability in the manufacturing process. It is further discussed that adhesive bonds distribute stresses evenly, reduce the possibility of fatigue, and seal the joints from corrosive species. It further asserts that, similarly, polymer-based coatings are commonly applied to the exterior surface of the manufactured products. These coatings provide protective layers that seal the surface from corrosive reactants, as well as provide a painted surface that can the aesthetically pleasing.

The composition disclosed in U.S. Pat. No. 6,620,308 B2 has a matrix functionality and an electrolyte functionality, wherein the electrolyte functionality is provided by a block copolymer or a graft copolymer. The matrix functionality provides an adhesive bond to a substrate, and the electrolyte functionality provides sufficient ionic conductivity to the composition to support a faradic reaction at an interface with an electrically conductive surface in contact with the composition, whereby the adhesive bond is weakened at the interface. The composition may be a phase-separated composition having first regions or substantially matrix functionality and second regions of substantially electrolyte functionality.

SUMMARY OF INVENTION

It is an object of the invention to provide a solution that eliminates or at least reduces the problems associated with the known distribution packages.

This object has been achieved with the provision of a connecting element or a packaging element adapted to or for temporarily holding together a plurality of secondary articles, such as packages, during transportation or distribution, and possibly also during display arrangement on a shelf in a store or the like or even during sale and transportation to the consumers home. This will be discussed in detail below. The connecting element comprises a base member provided with a first adhesion area adapted to hold a first secondary article to said base member and a second adhesion area adapted to hold a second secondary article to said base member, wherein the adhesion areas comprise an electrically weakable adhesive.

By using a connecting element provided with adhesion areas comprising an electrically weakable adhesive it is possible to provide new kinds of distribution solutions. The connecting element may be used to hold together packages or other kinds of products and articles.

It may e.g. be formed as board shaped members arranged beneath or on top of a pallet or set of packages. By holding the packages to the connecting element, the set of packages and connecting element will form a distribution unit with improved handleability. When the shop assistant has placed the distribution unit in place on the display shelf, the packages are easily released by application of voltage to the electrically weakable adhesive. Since there is no need for any tearing or cutting of any distribution package, there is no need for any additional space between the products or packages and the surrounding display shelves. In accordance with one embodiment the shop assistant simply slides a set of eight packages from the pile of product on the pallet lifter to the display shelf, the packages being held together by an underlay and a top board. Thereafter the assistant activates the internal battery applying a voltage to the adhesion areas with the electrically weakable adhesive and thereby releasing the top board from the packages. The assistant withdraws the top board from the display shelf and finalises the loading of the shelf with activation of the internal battery of the underlay, thereby releasing the packages also from the underlay. When the consumer picks the packages from the shelf they are easily picked from the shelf and underlay since they are already released from the underlay. It is also contemplated that in some cases the packages are released from the connecting element used during distribution and then put one by one on the display shelf.

The connecting element may also be provided as a semi-finished product comprising a base member provided with a first adhesion area adapted to hold a first secondary article to said base member and a second adhesion area adapted to hold a second secondary article to said base member, wherein the adhesion areas comprise a first active surface adapted to receive an electrically weakable adhesive, wherein the first active surface forms part of an electrical circuitry arranged to apply a voltage to said electrically weakable adhesive. In this configuration the connecting element is provided with the active surface whereas the electrically weakable adhesive is adapted to be applied to the active surface when the connecting element is to be connected to the secondary articles. The advantages of the connecting element has been discussed in detail above with reference to the embodiment of the connecting element with the electrically weakable adhesive applied to the adhesion areas.

The above objects have also been achieved with the provision of a package comprising a first adhesion area by which adhesion area said package is adapted to be temporarily connected to one or more other packages, wherein the adhesion area comprises an electrically weakable adhesive. A set of packages is held together during distribution by one or more packages provided with the electrically weakable adhesive. Numerous variations concerning when to release the packages are contemplated. The shop assistant lifts the set of packages to the display shelf and then releases them to leave them arranged together but released from each other. This way it will be possible to make use of the distribution solution for the shop assistant whereas the consumer does not notice any difference compared to the solution of today. It is also contemplated to release them and then putting them one by one on the shelf. This is suitable if the packages are to heavy or bulky to handle in sets of packages. It is also contemplated that the packages are released from the neighbouring packages by the consumer when lifting them from the shelf. This gives information to the consumer that this package has not been released before. This is e.g. useful for cooled or frozen products; if you have to release it you know that no other consumer has walked around in the store with the product in the shopping cart and then changed his or hers mind and put it back in the freezer. It is also contemplated that the packages are bundled together and sold together and only separated when the consumer puts the products in the cabinets at home or even when he or she is about to open the package. This may e.g. be used for selling a primary product and one or more associated products, such as pasta and pasta sauce, as a bundled package.

The package may also be provided as a semi-finished product comprising a first adhesion area by which adhesion area said package is adapted the to be temporarily connected to one or more other packages, wherein the adhesion area comprises a first active surface adapted to receive an electrically weakable adhesive, wherein the first active surface forms part of an electrical circuitry arranged to apply a voltage to said electrically weakable adhesive.

In this configuration the package is provided with the active surface whereas the electrically weakable adhesive is adapted to be applied to the active surface when the package is to be connected to said one or more other packages. The advantages of the package have been discussed in detail above with reference to the embodiment of the package with the electrically weakable adhesive applied to the adhesion area.

The voltage applied may be either alternating or direct depending upon the desired manner of weakening of the electrically weakable adhesive. The voltage may e.g. be applied by an external source, such as a battery, by electromagnetic waves, or by designing the package with active surfaces of different materials with different potentials, thereby forming an internal battery.

Preferred embodiments of the invention appear from the dependent claims. The preferred embodiments of the connecting element and the package in accordance with the discussion above will be discussed in connection with each other.

The connecting element or package may be provided with at least one conductor adapted to be used to apply a voltage to respective adhesion area. The first conductor on the connecting element or package is adapted to, in combination with a second conductor on said one or more secondary articles or packages, apply a voltage to respective adhesion area. This is, e.g., suitable for the bundling mentioned above, since the complete available envelope surface may be used. This is also useful for a solution where the consumer releases the packages when he or she picks them from the shelf. This way the activator or switch may be located on the package to pick whereas the active elements may be located on the other package. Thereby it is possible to, e.g., use a design with one active surface (being electrically conducting and adapted to be used to apply a voltage to the electrically weakable adhesive) on the package to be released and the other active surface (being electrically conducting and adapted to be used to apply an electrical voltage to the electrically weakable adhesive) on the package left on the shelf. By releasing the electrically weakable adhesive from the active surfaces of the package left it will leave anaesthetically attractive package without any remaining clod of adhesive.

The connecting element or package may be provided with a set of at least two conductors adapted to apply a voltage to respective adhesion area. This may in many cases simplify the design and production of the packages or connecting elements since the active package or connecting element carries all the necessary components. It may thereby be connected to different kinds of packages without any need for preparing those packages for the connection. This is e.g. advantageous when making a bundling only during a short campaign, where it is not economically feasible to adopt the package of the associated product to carry a part of the electrical circuitry.

The package may be provided with a plurality of adhesion areas, wherein a first adhesion area is adapted to temporarily connect said package to a second package and a second adhesion area is adapted to temporarily connect said package to a third package. This way an active package may be adapted to bundle together three packages. Such a design may also be used when the packages are arranged in a staggered manner where respective package, e.g., is connected to two neighbouring packages arranged offset in opposite directions a distance corresponding to half the width of the packages in respective direction.

The adhesion areas may be separated from each other. This way the connecting element or the package will add to the stability of the packages or articles bundled.

The package may comprise a first and a second adhesion area adapted to connect said package to a second package. Thereby the package will be stably connected to the second package.

The adhesion areas are electrically connected in parallel to each other. This way it will be easy to apply a voltage to the electric circuitry and thereby to apply the same voltage to all the adhesion areas at the same time and thereby to release all the adhesion areas simultaneously.

The conductors may have connecting portions adapted to be connected to an external source of electric power. This is especially useful for solutions where the electrically weakable adhesive is used for distribution purposes and is released by the shop assistant. This gives a simple design and it is possible to apply a relatively powerful voltage and thereby break or weaken strong adhesive areas. This also gives the opportunity to, in a simple way, provide an alternating voltage to the electrically weakable adhesive.

The connecting element or package may comprise a first and a second conductor being electrically connected to each other through a plurality of adhesion areas. This is a simple way of providing the above discussed parallel coupling of the adhesion areas.

The base member of the connecting element or the package may be formed of a non-conductive material, e.g. of plastic, paper, paper board or of glass. This way the conductors may simply be provided as printed or laminated conductors on the non-conductive material. There will be no immediate need for more complicated laminate structures with insulating layers, etc.

The base member of the connecting element or the package may be formed of paper board. This material is preferred since it is easy to provide a connecting element or package in paper board. It is also normally non-conducting making it easy to provide it with an electrical circuitry using e.g. a printing or laminating technique.

The connecting element or package may further comprise a first and a second active surface being electrically conducting and being arranged at a distance from each other and being adapted to be electrically connectable to each other via an electrical circuit, wherein the electrically weakable adhesive is adapted to bridge the distance between the first and second active surfaces. This way it is possible to in a controlled way apply a voltage across the electrically weakable adhesive. The two active surfaces are connectable to two different potentials thereby causing an electrical potential difference across the electrically weakable adhesive. As mentioned above, the voltage may be provided in a number of ways.

The connecting element or package may comprise an internal source of electrical power adapted to be activated or connected to the conductors to in a closed electrical circuit apply a voltage to respective adhesion areas. In this way, the package or connecting element may be released anywhere and by anyone. This is especially useful for solutions where the packages are released by the consumer when he or she picks them from the shelf and for solutions where bundled packages are to be released after being purchased.

The first active surface may be of a first material with a first electrode potential, and the second active surface may be of a second material with a second electrode potential, and wherein the first electrode potential differs from the second electrode potential. In this way the active surfaces as such will act as an internal electrical power source and will when connected to each other via an electrical circuitry outside the electrically weakable adhesive generate a current across the electrically weakable adhesive.

The connecting element or package may further comprise at least one printed and/or laminated battery. This an expedient way of providing an internal source of electrical power.

The at least one printed and/or laminated battery may be printed on a first carrier layer. This is an expedient way of providing a battery forming an internal source of electrical power. As indicated below the first carrier layer may also be used to carry one or more active surfaces. Thereby it is easy to provide a connection between the battery and the one or more active surfaces on the first carrier layer.

The connecting element or package may further comprise a first carrier layer with a first surface, the first and second active surfaces being supported by the carrier layer, wherein the first active surface is separated from the second active surface a first distance along the surface of the substrate, wherein the laminate structure is adapted to receive an electrically weakable adhesive bridging said distance between the active surfaces. In this way it is possible to pre-manufacture parts of the structure with the active surfaces on one carrier layer. When the connecting element or package is to be bundled, the electrically weakable adhesive is applied to the active surfaces and the second article is put onto the adhesive, whereby the connecting element and secondary articles or packages are connected to each other. This design also makes it possible to provide both active surfaces on one and the same side of the layer of the electrically weakable adhesive, and thereby on one and the same connecting element or package. Such a design facilitates the provision of any circuitry, since the circuitry in such a case does not have to bridge any interface between the a connecting element and a secondary article or packages.

A portion of at least one of said active surfaces may be exposed and adapted to be covered by said adhesive. In this way the electrically weakable adhesive will in itself provide the conductive bridge to this active surface.

At least a portion of the first active surface and at least a portion of the second active surface are exposed and adapted to be covered by said adhesive. In this way the electrically weakable adhesive will in itself provide the conductive bridge to both active surfaces.

The active surfaces may be shaped such that a projection of the first active surface on the surface of the carrier layer essentially surrounds a projection of the second active surface on the surface of the carrier layer. In this way the area in which the electrically weakable adhesive will be broken or weakened will be relatively large compared to the size of the active surfaces. In this way the energy losses due to resistance in the active surfaces will be minimized. It will furthermore provide a rather concentrated weakening of the adhesive, which will facilitate the opening of the package.

A projection of the first active surface on the first surface and a projection of the second active surface on the first surface may at least partly overlap each other, wherein the laminate structure further comprises an insulating layer provided between the first and second active surfaces at least at the overlap. By providing active surfaces with overlaps and insulating layers there between it is possible to optimise the shape of the electrically weakened area, without having to be limited by separation in the plane of the carrier layer.

The first active surface may be formed as a closed loop with its projection on the surface of the first carrier layer surrounding the projection of the second active surface on the surface of the first carrier layer, wherein the second active surface has a connecting portion extending out of the closed loop of the first active surface, and wherein the electrically insulating layer separates the connecting portion from the first active surface. In this way the electrical potential will be bridged by the electrically weakable adhesive to the first active surface all the way around the second active surface. This will give a relatively large weakened area compared to the size of the second active surface.

The package or the connecting element may further comprise an electrically weakable adhesive bridging said distance between the active surfaces, and adapted to be located between the active surfaces and a second carrier layer. It may e.g. be noted that packages may be sold to a food producer with active surfaces provided on the packages but without any electrically weakable adhesive thereon. The electrically weakable adhesive may then be applied when the package is to be filled and closed for subsequent distribution.

The package or connecting element may further comprise a non electrically weakable adhesive arranged as a layer adapted to be located between the electrically weakable adhesive and a second carrier layer. In this way it is possible to pre-manufacture the structure with active surfaces and electrically weakable adhesive and then to apply a conventional adhesive on top of this when the package or connecting element is to be connected to a package for the first time. When connecting element or the package is to be released from the secondary package(s) electrically weakable adhesive is weakened and the conventional adhesive will be released together with the package not carrying the active surfaces. It is also contemplated to provide two layers of electrically weakable adhesive, one layer in the pre-manufacturing step and a second layer when the connecting element or package is connected to the secondary packages.

The above objective has also been achieved by an article forming a handling element comprising a first adhesion area, adapted to temporarily holding at least one secondary article to said handling element, and an engagement area by which the handling element and the secondary article connected thereto are adapted to be handled, wherein the adhesion area comprises an electrically weakable adhesive. Such a design is e.g. useful for handling and displaying consumer articles on a rack. It may e.g. be used to display pencils or similar products that today are put behind a plastic cover on a paper board. The electrically weakable adhesive may be used to connect the article directly to the paper board.

Preferred embodiments of the invention appear from the dependent claims.

The article may further comprise a second adhesion area, adapted to temporarily holding at least one secondary article to said handling element, wherein the second adhesion area comprises an electrically weakable adhesive.

This second adhesion area may be used to further secure a first secondary article to the handling element or to secure another secondary article to the handling element.

The handling element may form a sling with the engagement area located between said adhesion areas. In this way the secondary article(s) connected to the handling element may easily be handled using the sling shaped portion as a handle for carrying or hanging the articles on a rack or the like.

The adhesion areas may be separated from each other. In this way the handling element will add to the stability of the secondary article(s) connected to the handling element.

It may also be noted that the features of the embodiments discussed in detail with respect to the package and the connecting element is also applicable to the handling element. The advantages with the different features has also been discussed in detail with reference to the connecting element and the package. Reference is made to that detailed discussion.

It may also be noted that the connecting element, the package and the article forming a handling element may be combined in different modes.

It is e.g. contemplated to use a handling element to facilitate the distribution of one or more packages being connected to each other using an electrically weakable adhesive. In such a design it is also contemplated that the activation of the voltage separating the packages from each other, also separates the handling element from the packages. In one embodiment a first active package is connected to a conventional package and both of the packages are connected to a handling element. In another embodiment several active packages are connected to each other and to a handling element.

In any case the articles connected to the handling element may also be connected by a connecting element. In accordance with one embodiment several active packages are on one hand connected to each other side by side using adhesion areas comprising an electrically weakable adhesive and on the other hand connected to a connecting element, e.g. forming an underlay. This set up of packages and connecting element may also be connected to a handling element, e.g. forming a sling to be used as a carrying grip.

In short the invention may also be defined as a method of distributing a plurality of articles, such as packages, comprising; providing a connecting element, connecting a least two secondary articles to the first and second adhesion area of the connecting element, respectively, distributing the connecting element and the thereto connected secondary articles, and releasing the secondary articles from the connecting element.

It may also be defined as a method of distributing a plurality of packages, comprising; providing at least one primary package (provided with adhesion area(s) as described above), connecting at least one secondary package or at least a second primary package to said primary package, distributing the primary package and the thereto connected other package, and releasing the packages from each other.

It may also be defined as a method of distribution a secondary article, comprising; providing an article forming a handling element (provided with adhesion area(s) as described above), connecting at least one secondary article to said handling element, distributing the handling element and the thereto connected secondary article, and releasing the secondary article from the handling element.

BRIEF DESCRIPTION OF THE DRAWINGS

The invention will by way of example be described in more detail with reference to the appended schematic drawings, which shows a presently preferred embodiment of the invention.

FIG. 11a shows two packages of the kind shown in FIG. 10 after they have been separated from each other.

FIG. 11b shows in enlargement a portion of the package of FIG. 11a.

DETAILED DESCRIPTION OF PREFERRED EMBODIMENTS

Figure 1A:
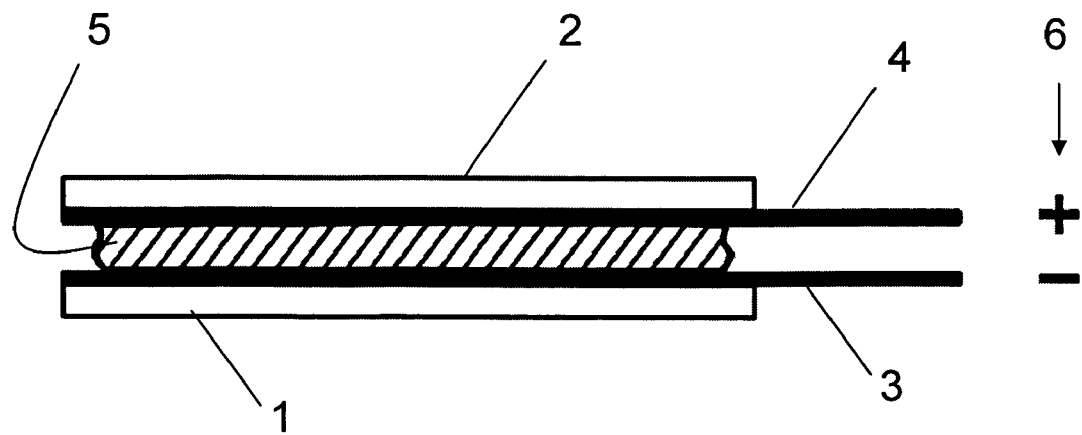
FIG. 1a-c shows a first basic structure in which different layers are connected to each other using an electrically weakable adhesive, wherein the three figures indicate three different alternatives of how an electrical energy may be applied in order to weaken the adhesive.

The use of controlled delaminating material in the collation of products in transit or handling and subsequent separation of the products, diminish the need for extra material and facilitate the distribution of products.

The connecting elements, the packages and the handling elements described in the following make use of an electrically weakable adhesive material. The inventive connecting elements, packages and handling elements are provided with at least two active surfaces acting as electron and/or ion emitter and receiver connected with a bonding layer formed by the electrically weakable adhesive material. The bonding layer possesses adhesive properties and conductive properties. When a voltage is applied between the active surfaces and current flows through the bonding layer, bonds formed in or between the bonding layer and at least one of the active surfaces are broken or weakened. Thus, the bonding layer forms an electrically weakable adhesive.

The electrically weakable adhesive may bridge the complete distance between the active layers but may also be completed with additional layers of other materials capable of performing the necessary electrical and/or mechanical connection. Such materials may be conventional non electrically conductive adhesives, polymers, varnishes, or the like, or electrically conductive versions of respective material.

The electrically weakable material and different basic configurations of the active surfaces will initially be discussed in detail separately from the specific designs of the packages. The different designs of the packages will thereafter be discussed in detail. In some cases the design of the package will be discussed in combination with a specific kind of basic configuration. It should however be noted that this is for exemplifying purposes and that the different basic configurations may be combined with the different designs of the packages.

According to one embodiment the bonding layer is composed of a composition possessing both matrix functionality and electrolyte functionality. The matrix and the electrolyte functionalities may be formed by a single phase or several separate phases.

The matrix functionality provides the adhesive properties necessary to bind surfaces to one another mechanically or chemically. The matrix functionality may be provided by polymers, polymer resins or fibres that possess adhesive properties.

The electrolyte functionality provides the ion conductivity necessary to support a faradic reaction, i.e. an electrochemical reaction in which a material is oxidized or reduced, or some other chemical/physical reaction. The materials are preferably chosen and designed such that the reaction occurs at the interface between one or both of the active surfaces and the bonding layer. Alternatively the bonding layer may be designed such that the reaction will occur within the bonding layer. This may, e.g., be accomplished by providing islands of a material with electrolyte functionality within the matrix material. The electrolyte functionality may be provided by adding a salt to the material or by modifying the polymer so that it includes ion-coordinating moieties.

The electrically weakable adhesive used in the inventive packages may be the electrochemically disbondable composition ElectRelease™ supplied by EIC laboratories and disclosed in more detail in U.S. Pat. No. 6,620,308.

Figure 1B:
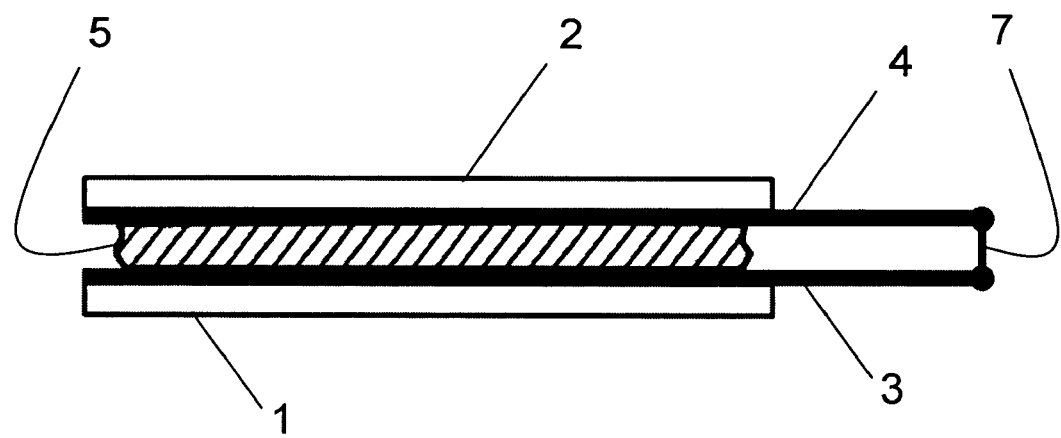
Figure 1C:
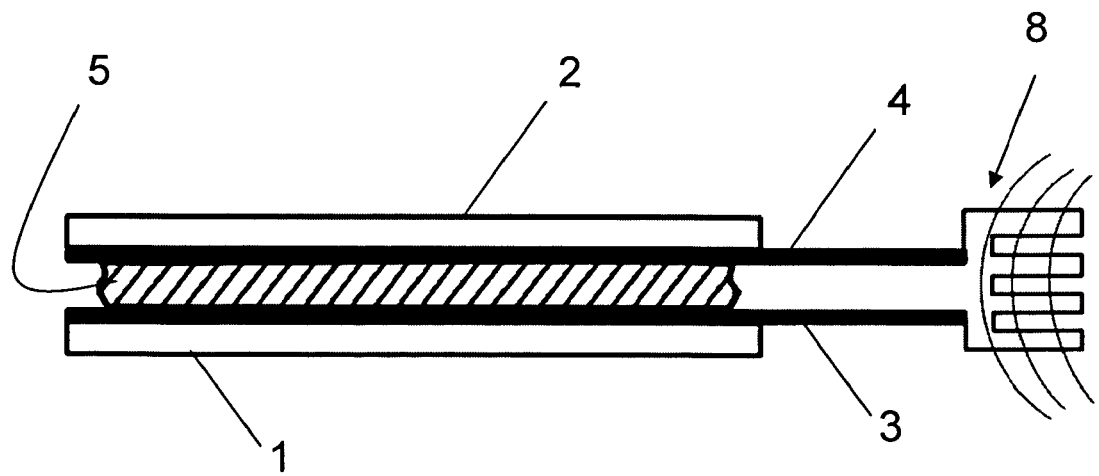

FIG. 1a-1c shows a common basic structure with three different alternatives of how to apply the electrical energy to break or weaken the bond of the bonding layer.

The basic structure comprises a first carrier layer 1 and a second carrier layer 2. A first active layer 3 is laminated on the first carrier layer 1. A second active layer 4 is laminated on the second carrier layer 2. The active layers are bonded together by a bonding layer 5, comprising an electrically weakable adhesive.

In FIG. 1a, the potential difference between the active layers 3, 4 is adapted to be provided by an external voltage source 6 (indicated by the + and − signs). This external source may e.g. be a battery provided in a handheld device, or a battery being attached to the package, the connecting element or to the handling element, and connectable to the active layers 3, 4. One or several batteries can, e.g., be printed or laminated on one of the carrier layer and connected to the active surfaces In this design the two active layers 3, 4 may, but need not, be formed of the same material. When a voltage is applied between the active surfaces 3, 4 current will flow between the active surfaces 3, 4 via the bonding layer 5. This will cause the bonds in the bonding layer 5 or between the bonding layer 5 and one or both of the active surfaces 3, 4 to break or to weaken. The current applied may be in the form of direct current or alternating current. A direct current is preferably used to weaken the bonds in the bonding layer 5 or between one of the active surfaces 3 or 4 and the bonding layer 5. An alternating current is preferably used to weaken the bonds in the bonding layer 5 or between both of the active layers 3, 4 and the bonding layer 5.

In FIG. 1*b*, the electrical potential difference between the active layers 3, 4 is adapted to be provided by making the active layers 3, 4 of different materials with different electrode potentials. If the two active layers 3, 4 are connected, e.g. by moving a switch 7 to a position where it connects the two layers 3, 4, a closed circuit is formed and current will flow through the bonding layer 5, thereby causing the adhesive bond to break or weaken. For example, copper and graphite can be used as active layers 3, 4 with different potentials. This design will create a flow of direct current between the active layers 3, 4 via the bonding layer 5.

In FIG. 1*c*, the electrical potential difference between the active layers 3, 4 is provided by supplying electro magnetic waves, e.g. radio waves, to the package. The active layers 3, 4 or a separate member 8 connected to the active layers 3, 4 may be adapted to be subjected to the electro magnetic waves and transform this wave to an electrical potential difference between the active layers 3, 4. The AC voltage generated by the electro magnetic waves can be used directly or transformed to DC voltage by a rectifier, e.g. a half-wave rectifier or a full-wave rectifier, connected to the active surfaces. The member 8 may e.g. be an antenna or coil. In this design the two active layers 3, 4 may, but need not, be formed of the same material.

Figure 2:
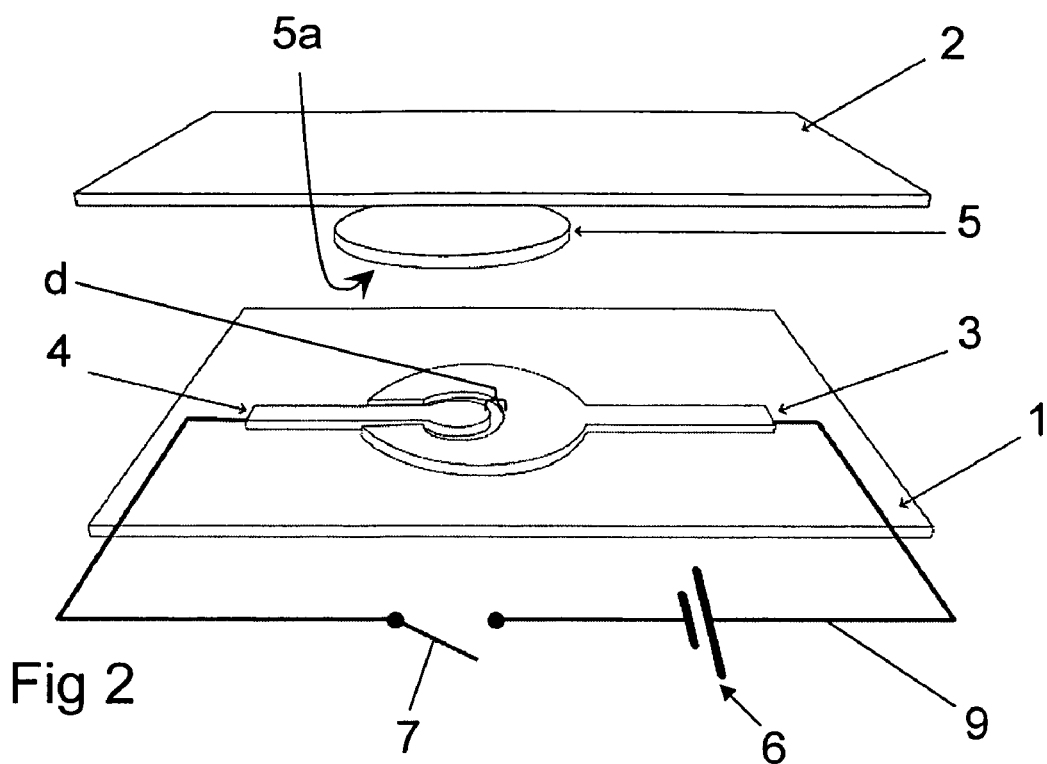
FIG. 2 shows in an exploded view a first embodiment of a second basic structure with the active surfaces arranged on the same side of the adhesive layer.
Figure 3:
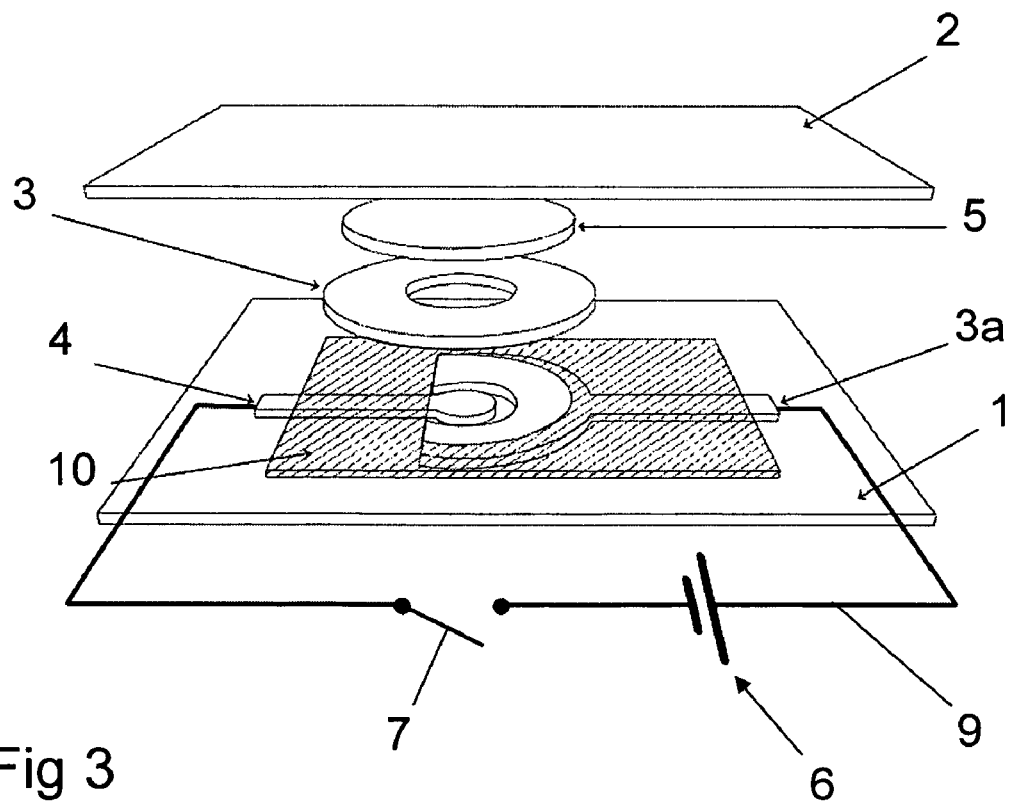
FIG. 3 shows in an exploded view a second embodiment of the second basic structure.
Figure 4:
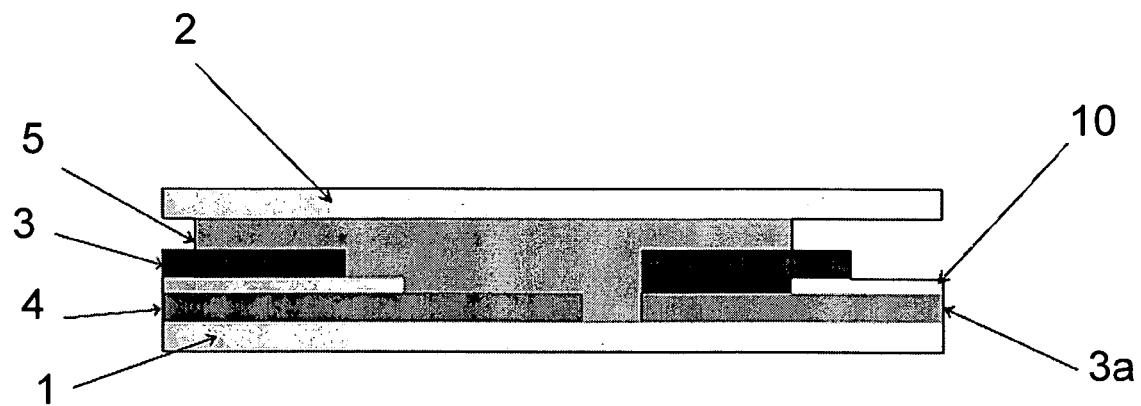
FIG. 4 shows a cross-section of the structure in FIG. 3.
Figure 5:
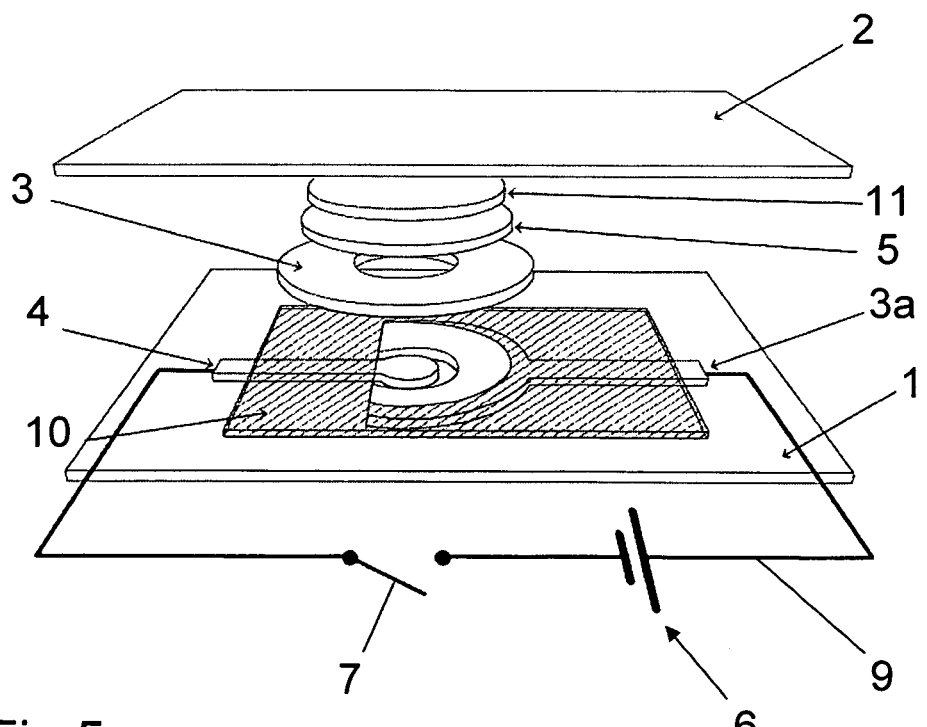
FIG. 5 shows in an exploded view of a third embodiment of the second basic structure.

FIG. 2-5 show embodiments wherein the active surfaces are arranged on the same side on a carrier layer. In FIGS. 2, 3 and 5, the different layers are for clarity reasons illustrated at a distance from each other. However, it is apparent that in practice the layers forms a laminated structure. From the description below it will follow in which cases the different disclosed layers need to be in direct contact with each other and when there may be one or more additional, non-disclosed layers between the disclosed layers. It may also be noted that in direct contact may dependent upon the situation mean in mechanical contact or in electrical contact. Furthermore, the teachings concerning different ways of applying the voltage discussed in FIG. 1*a-c* are applicable also for the embodiments of FIG. 2-5.

FIG. 2 shows an embodiment wherein the active surfaces 3, 4 are arranged on the same side of the bonding layer, instead of being provided as two separate layers 3, 4 on either side of the bonding layer 5 formed of the electrically weakable adhesive as in FIG. 1*a-c*. The structure comprises two carrier layers 1, 2 that are to be delaminated. The carrier layers 1, 2 may e.g. be made of paper, paper board or plastic, but other materials are contemplated. The active surfaces 3, 4 are arranged on one side of the bonding layer 5 and are separated from each other a distance d along the surface 5*a* of the carrier layer 1.

The active surfaces 3, 4 may be applied to the first carrier layer 1 using any conventional method, they may e.g. be printed or laminated onto the carrier layer 1. The active surfaces 3, 4 may be made of any conductive material, e.g. metal ink or foil. The bonding layer 5 is provided between respective active surface 3, 4 and the second carrier layer 2, thereby bonding the active surfaces 3, 4 to the second carrier layer 2 and in turn thereby bonding the two carrier layers 1, 2 to each other. The bonding layer 5 typically reaches the first carrier layer 1 in the small accessible area formed by the gap or distance d between the active surfaces 3, 4. As shown in FIG. 2, one of the active surfaces 3 has an area of distribution formed as an open half-circle partially enclosing the other active surface 4. This other active surface 4 has an area of distribution formed as a circle. The two active surfaces 3, 4 form a gap formed as a part of a ring, in this case a part of a circular ring, having a width defined by the above mentioned distance d. Other shapes, such as squares are also contemplated.

The active surfaces 3, 4 are also connected or connectable to each other via a circuit 9 comprising an external power supply 6 and a switch 7.

When a voltage is applied between the active surfaces 3, 4, e.g. by the closure of the switch 7, current will flow between the active surfaces 3, 4 via the bonding layer 5. This will cause the bonds in the bonding layer 5 or between the bonding layer 5 and one or both of the active surfaces 3, 4 to break or to weaken. The accessible area of the first carrier layer 1 between the active surfaces 3, 4 may be made so small that even if the bonding layer 5 reaches the first carrier layer 1, the force needed to break the bond between this accessible area and the bonding layer 5 is negligible.

The power supply 6 can, e.g., be at least one battery that is printed or laminated on the carrier layer 1 and connected to the active surfaces 3, 4. This way, the battery 6 and the active surfaces 3, 4 can be printed or laminated on the carrier layer at least partly in the same process step. In order to increase the power supply, several batteries can be printed on the carrier layer 1 and connected to the active surfaces. This enables all batteries and the active surfaces to be printed on the carrier layer at least partly in the same process step, which facilities the manufacturing of the structure.

In an alternative embodiment to the one shown in FIG. 2, the active surfaces 3, 4 are formed of different materials with different electrode potentials. In such an embodiment the external power supply 6 may be dispensed with. When the circuit 9 is closed by the switch 7, current will flow between the active surfaces 3, 4 via the bonding layer 5, which will cause the bonds in the bonding layer 5 or between the bonding layer 5 and one or both of the active surfaces 3, 4 to break or to weaken.

FIGS. 3 and 4 shows yet another embodiment of a kind similar to the one shown in FIG. 2. In the embodiment of FIGS. 3 and 4, the active surfaces 3, 4 are separated out of the plane by an insulating layer 10, but are still on the same side of the bonding layer 5 compared to the second carrier layer 2. The first active surface 3 is electrically connected to a connector 3*a* that formed part of the first active surface 3 in the embodiment of FIG. 2.

The insulating layer 10 separates the conducting elements and protects them from tear and wear. The connector 3*a* is in contact with the first active surface 3, but there is no direct connection between the connector 3*a* and the second active surface 4.

The second active surface 4 is provided on the carrier layer 1 as in the embodiment of FIG. 2. The insulating layer 10 is provided on this structure. Above the insulating layer 10 is the first active surface 3 arranged, and finally on top of this is the bonding layer 5 arranged. Since the first and second active surfaces 3, 4 are separated out of the plane, the first active surface 3 may be formed as a circular member completely surrounding the circular end portion of the second active surface 4. The active surfaces 3, 4 and the insulating layer 10 provides a gap between the active surfaces 3, 4 adapted to be bridged by the bonding layer 5. The bonding layer 5 may extend all the way from the second carrier layer 2 to the first carrier layer 1 and thereby provide a direct adhesion between the first and second carrier layer 1, 3.

The active surfaces 3, 4 are also connected or connectable to each other via a circuit 9 comprising an external power supply 6 and a switch 7.

When a voltage is applied between the active surfaces 3, 4, e.g. by the closure of the switch 7, current will flow between the active surfaces 3, 4 via the bonding layer 5. This will cause the bonds in the bonding layer 5 or between the bonding layer 5 and one or both of the active surfaces 3, 4 to break or to weaken. The accessible area of the first carrier layer 1 between the active surfaces 3, 4 may be made so small that even if the bonding layer 5 reaches the first carrier layer 1, the force needed to break the bond between this accessible area and the bonding layer 5 is negligible.

In an alternative embodiment to the one shown in FIGS. 3 and 4, the active surfaces 3, 4 are formed of different materials with different potentials. In such an embodiment the external power supply 6 may be dispensed with. When the circuit 9 is closed by the switch 7, current will flow between the active surfaces 3, 4 via the bonding layer 5, which will cause the bonds in the bonding layer 5 or between the bonding layer 5 and one or both of the active surfaces 3, 4 to break or to weaken.

FIG. 5 shows an alternative embodiment to the one shown in FIGS. 3 and 4, wherein the bonding layer 5 is adapted to carry a second bonding layer 11. This second bonding layer 11 may be formed of an adhesive that do not have to be conductive or electrically weakable. By providing this second bonding layer it is possible to pre-manufacture the first carrier layer 1 with the active surfaces 3, 4 and the bonding layer 5, and then finally apply a second bonding layer 11 on the electrically weakable bonding layer 5 when the second carrier layer 2 is to be fastened to the first carrier layer 1. This additional bonding layer 11 may also be used in the design disclosed in FIG. 2.

An artisan will realise that there exists several alternatives to and combinations of the above disclosed embodiments. A brief discussion of some these alternatives follow hereinafter.

Respective active surface/layer may be arranged directly or indirectly via a laminating layer or the like on respective carrier layers. The active layer may in it self form both active surface and carrier layer.

As mentioned above the active surfaces may be separated in the plane and/or out of the plane. In order to separate the active surfaces out of the plane, an insulating layer, e.g. varnish, may be used. Insulating layers may also be used to separate conductive elements, such as active surfaces, from the carrier layer in cases when the carrier layer is conductive. Additional conductors may be arranged e.g. between the bonding layer and the second carrier layer in order to increase the conductivity in the plane of the structure.

The active surfaces are electrically conductive surfaces, conductors, and are preferably coated, printed or laminated on at least one carrier layer. However, if the carrier layers are electrically conductive, no extra active surfaces are needed. The active surfaces may be composed of any electrically conductive material, e.g. copper, aluminium or graphite. The active surfaces may for example be in the form of a metal ink.

The carrier layer represent surfaces that are to be delaminated by the electrical force and can be of any conductive or non-conductive material, e.g. paper, paper board, glass, metal, wood, moulded fibres or plastic. Two opposite sides of an opening of a package may for example represent a first and a second carrier layer. This will discussed in more detail below.

In accordance with one embodiment the carrier layers are formed of carton boards and the active layers are formed of an aluminium foil with oxide. The active surfaces are moisturized with a salt solution and bonded together using a composition comprising polyurethane. When a voltage is applied over the laminate structure, the aluminium oxide on the positively charged foil dissolves whereby the laminate is broken. The electrical force may be applied by any of the methods referred to above and in FIG. 1a-c.

The delaminating material structure described above may be used whenever the strength of a seal needs to be released, for example in the construction of packages. By providing the material structure as described above the packages may be opened by the application of a voltage. It can be used in all kinds of packages, such as cans, jars, bottles, cartons and blister packages. It may also be used together with all kinds of materials, such as paper, paper board, glass, metal, wood, moulded fibres or plastic. Two opposite sides of an opening of a package may represent a first and second carrier layer and the delaminating material described above may be arranged between the carrier layers.

Furthermore, the controlled delaminating material may be used for collation of products in transit or handling and subsequent separation of the products, for separating packages bonded together and for tamper-proofing goods. It may also be used to limit or change the properties of a product before it is purchased in order to prevent theft. Collation of products, tamper-proofing a product or preventing theft of a product may be done by binding existing parts or elements of the product or products together or by binding additional elements to the product or products, using the controlled delaminating material.

In one embodiment for holding packages together, a connecting element is adapted to temporarily hold together a plurality of packages, which connecting element has a first adhesion area adapted to hold a first package to the body and a second adhesion area adapted to hold a second package to the body. The adhesion areas further comprise an electrically weakable adhesive, i.e. a bonding layer. The connecting element is provided with a set of active layers adapted to conduct an electric current through the bonding layer.

Figure 6:
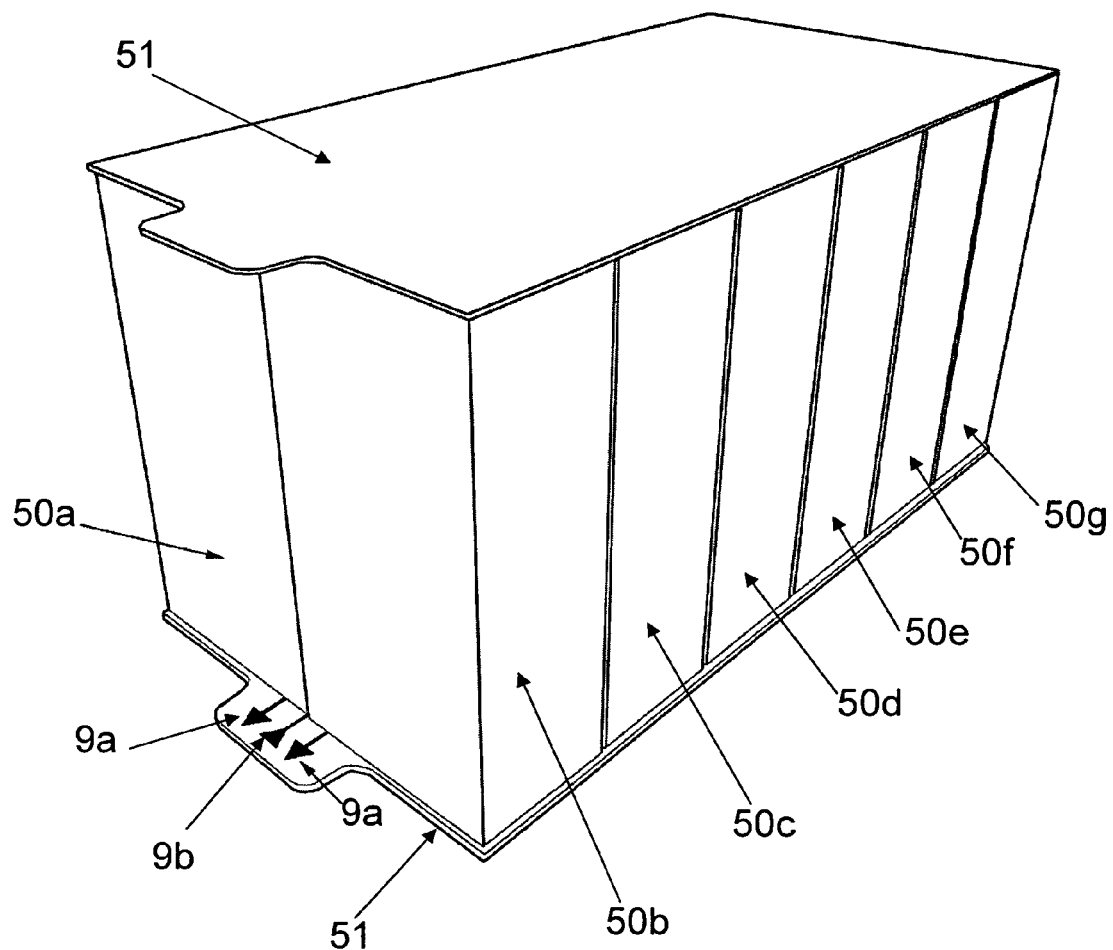
FIG. 6 shows an embodiment where twelve packages are being held together by two panels.

FIG. 6 shows an application wherein a full pallet of packages 50a-g are interlocked using a connecting element 51 which make use of a controlled delaminating material. Interlocking a full pallet saves packages from damage or from distorting during distribution. Individual packages 50a-g are collated by the attachment of a connecting element 51, for example a carton board sheet 51. The surface, or parts of the surface, of the board sheet 51 facing the packages is printed with active layers and a bonding layer possessing adhesive as well as conductive properties is applied between the active layers and the packages 50 to be interlocked. In store, the packages 50 may be released and displayed on the pallet by the application of a voltage across the active layers whereby current will flow through the bonding layer causing a disbanding reaction to occur in the bonding layer or at the interface between the bonding layer and one or both of the active layers.

Figure 7:
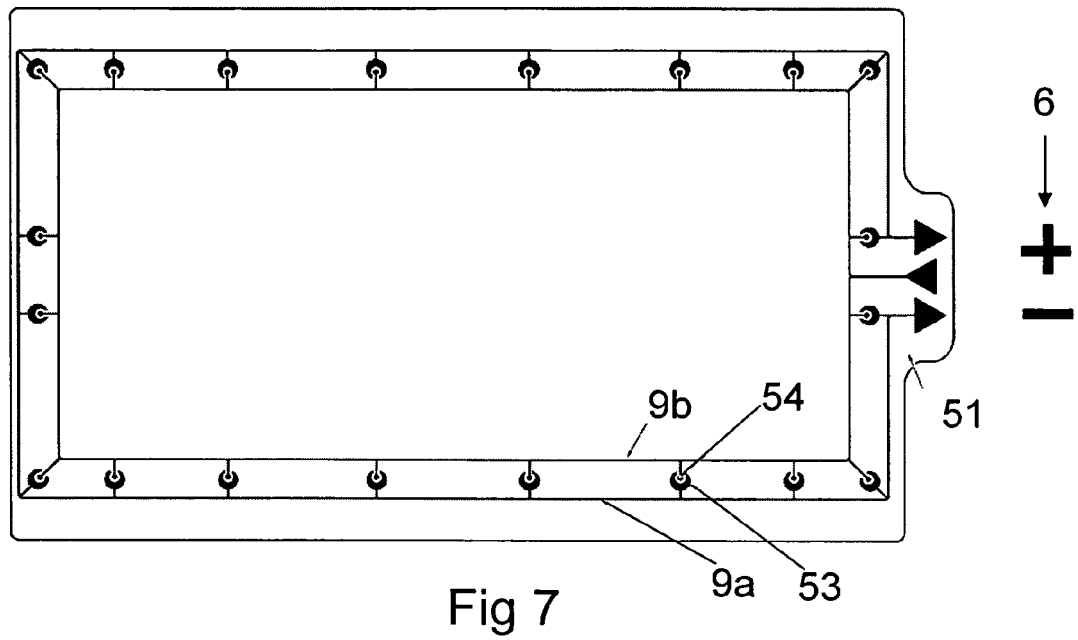
FIG. 7 shows a first embodiment of a panel as shown in FIG. 6.
Figure 8:
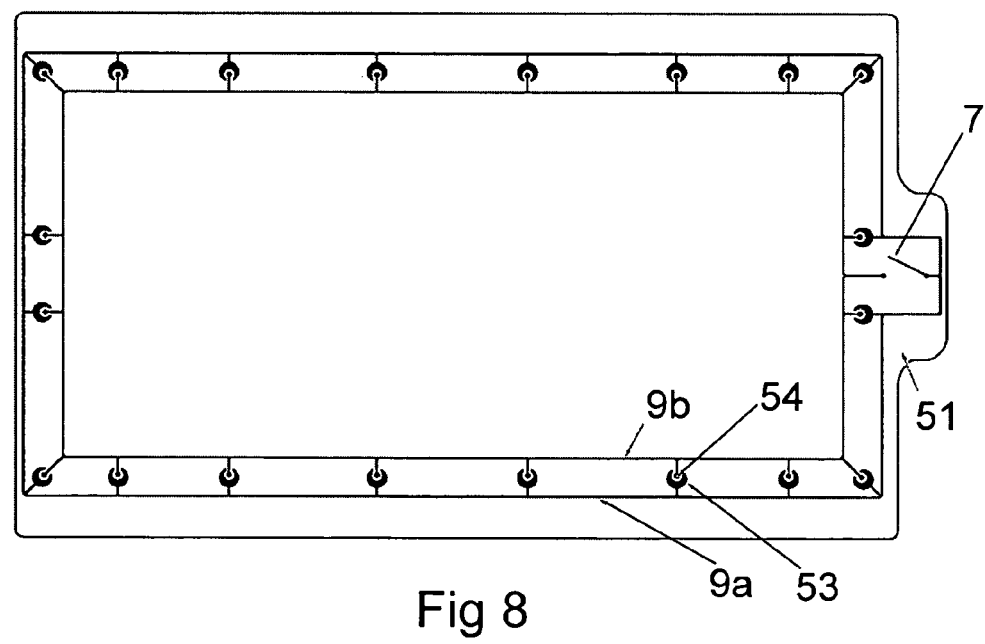
FIG. 8 shows a second embodiment of a panel as the one shown in FIG. 6.
Figure 9:
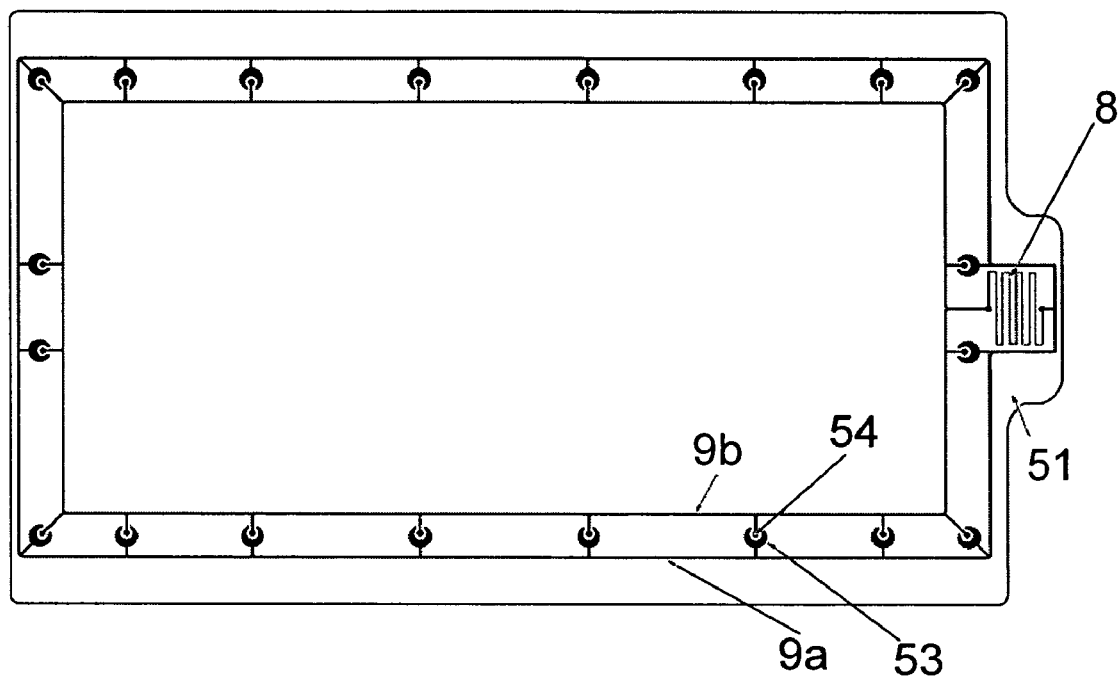
FIG. 9 shows a third embodiment of a panel as the one shown in FIG. 6.

FIG. 7-9 show examples of how active layers 53, 54 may be arranged on the carton board sheet 51.

FIG. 7 shows an example wherein a first circuit 9a is printed on a carton board sheet 51. A second circuit 9b is printed on the board sheet at a distance from the first circuit 9a. In connection with said first circuit 9a, a first set of active surfaces 53 are arranged at short intervals on said board sheet. A second set of active surfaces 54 are arranged in connection with said second circuit 9b. Respective second active surface 54 is arranged at a small distance from respective first active surfaces 53. This has been disclosed in more detail with reference to FIG. 1-5. FIG. 7 discloses a design that has been discussed in detail with reference to FIG. 2-5.

Respective active surfaces 53, 54, arranged at a small distance from each other, form a pair of active surfaces 53, 54. A bonding layer is applied between the active surfaces 53, 54 and the packages 50a-g. The bonding layer is applied in spots such that each spot covers each pair of active surfaces 53, 54. The set of active surfaces 53, 54 and electrically weakable adhesive 55 forms an electrically weakable adhesion area. As shown in FIG. 7-10 a plurality of such pairs of active surfaces 53, 54 and the accompanying electrically weakable adhesive is arranged along the circumference of the connecting element 51. The connecting element 51 of FIG. 7 is adapted to be connected to an external source 6 of electrical power (indicated by the + and − signs). When the connecting element 51 is connected to the external source 6 current will flow in the first and second circuits 9a, 9b via each pair of active surfaces 53, 54 and conducting, electrically weakable adhesive.

In the embodiment shown in FIG. 8, the active surfaces 53, 54 are of different materials with different potentials. Preferably, also the circuits 9a, 9b are of respective materials of different potentials. The circuits 9a, 9b may be connected by a switch 7. When the switch is open, no current flows through the bonding layer 55. When the switch is closed, current will flow through the bonding layer between the active surfaces 53, 54 thereby causing bonds in the bonding layer or between the bonding layer and one or both of the active surfaces 53, 54 to break or to weaken.

In yet another alternative embodiment, the electrical energy may be generated by the application of electromagnetic waves. FIG. 9 shows an example of an embodiment wherein electromagnetic waves, such as radio frequencies, generates current in an antenna 8 arranged between said circuits 9a, 9b.

In an alternative embodiment for holding packages together, the packages may be held together directly using controlled delaminating materials. In one example of this embodiment, multi packs are held together and released after purchase. Such a design is shown in FIG. 10 and FIG. 11a-b.

Figure 10:
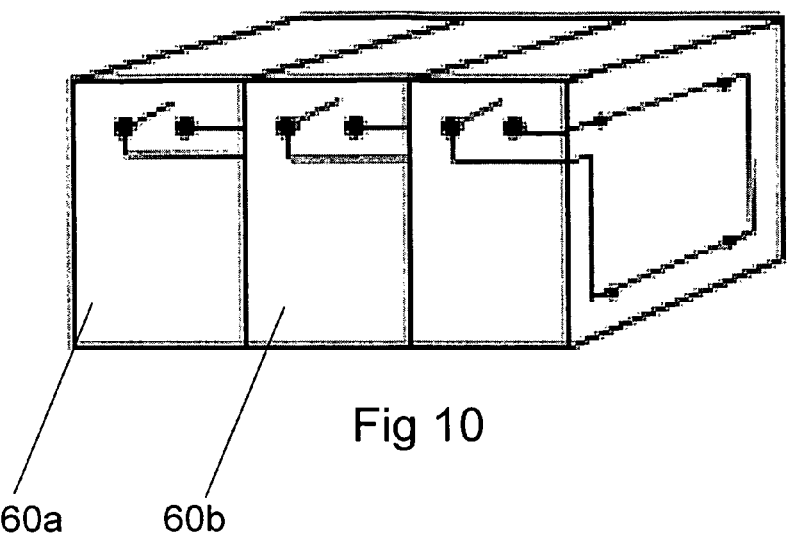
FIG. 10 shows three packages held together to form a distribution unit.

FIG. 10 is a schematic drawing, which shows an example wherein three packages are held together using controlled delaminating materials.

The principle will be discussed in more detail with reference to FIG. 11a-b, wherein two packages has been separated slightly in order to make all components visible.

Figures 11A, 11B:
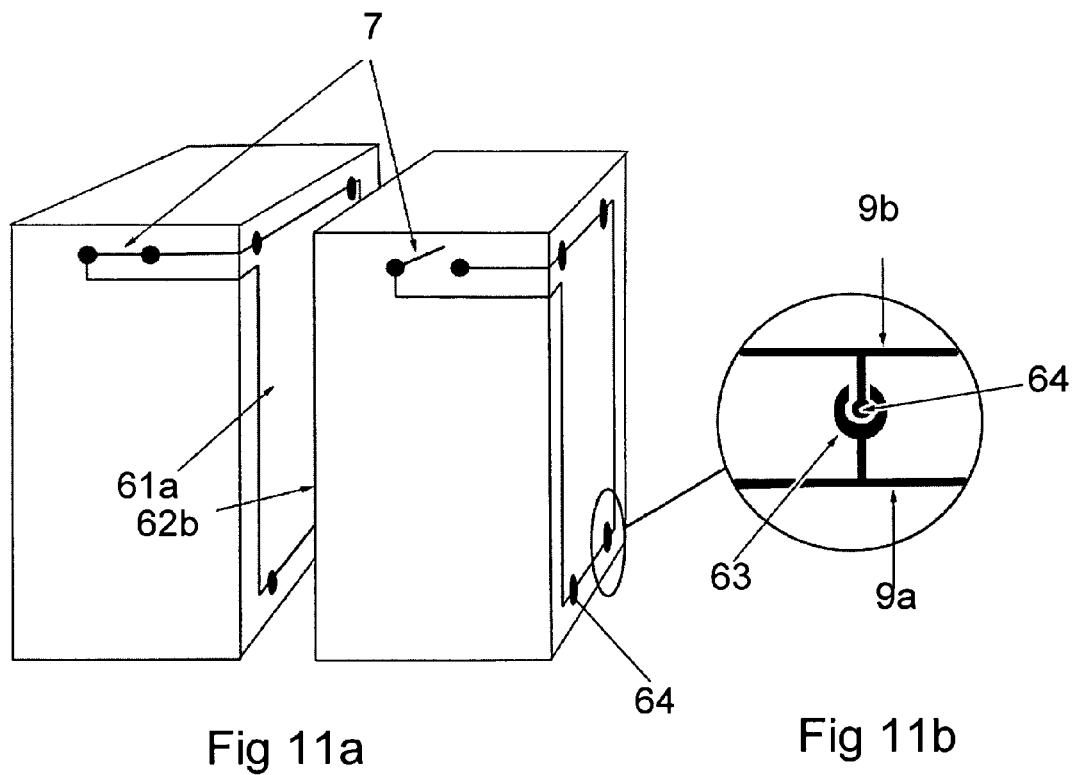

In FIG. 10 and FIG. 11a-b the left package 60a is provided with a double connector circuit 9a, 9b (as shown in detail in FIG. 7-9) and a switch 7 located on an accessible side of the package 60a. The circuits 9a, 9b extends to a surface 61a facing a neighbouring package 60b. The circuits 9a, 9b extend essentially along the perimeters of the surface 61a facing the neighbouring package 60b and are as shown in detail in FIG. 11b provided with active surfaces 63, 64 and an electrically weakable adhesive layer (not shown).

Thus, in this example, the side 61a of the package 60a forms the first carrier layer. The active surfaces 63, 64 and the circuits 9a, 9b may be arranged on the said surface 61a of the package 60a in a pattern similarly to the one described above with reference to FIG. 2-5. Spots of bonding layers may be applied between each pair of active surfaces and the side 62b of the other package 60b facing the first package 60a, whereby the packages are glued together. When the circuit 9a, 9b is open, no current flows through the bonding layer 65, and the packages 60a, 60b remains glued together. When the circuit 9a, 9b is closed, current will flow through the bonding layer 65 causing bonds therein or between the bonding layer 65 and one or both of the carrier layers 61a, 62b to break or to weaken, and the packages may easily be separated. As an example, the circuit 9a, 9b may be closed by the user pressing a button arranged on the outside on the package, which causes a switch 7 to close. The current needed to break or weaken the bonds may be applied by any of the methods described above. Thus, the active surfaces 63, 64 may be of different materials with different potentials. Alternatively, the electrical energy may be applied by an external electrical source or it can be generated by electromagnetic waves. Further layers may be applied between the two connected surfaces of the packages; such layers may be insulating layers, further conducting layers or layers of conventional adhesives as described above.

Figure 12A:
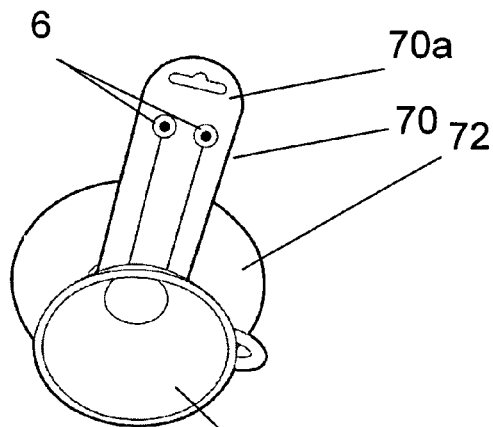
FIGS. 12a and 12b shows a set of secondary articles in the form of a cup and a saucer connected to a handling element.
Figure 12B:
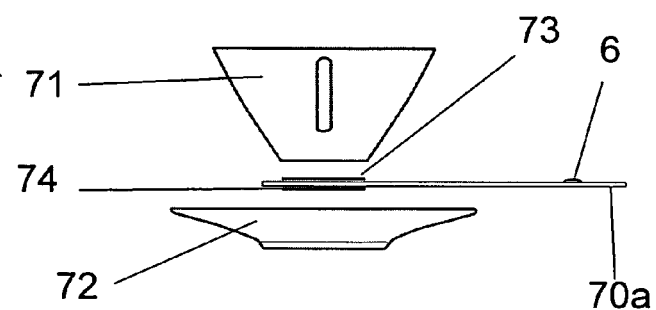

FIGS. 12a and 12b shows a set of secondary articles in the form of a cup 71 and a saucer 72 connected to a handling element 70.

The handling element comprises a first adhesion area 73 to which the cup 71 is connected and a second adhesion area 74 to which the saucer is connected. The adhesion areas 73, 74 are located on opposite sides of a disc or board shaped handling element 70. The handling element 70 comprises further an engagement portion 70a in the form of an extension provided with a through-going opening for hanging the handling element (with the thereto connected cup and saucer) on a display rack. The handling element is further provided with circuitry 6 for connection to an external source of electrical power. The adhesion area comprises an electrically weakable adhesive and may be designed in accordance with the disclosure above.

Figure 13:
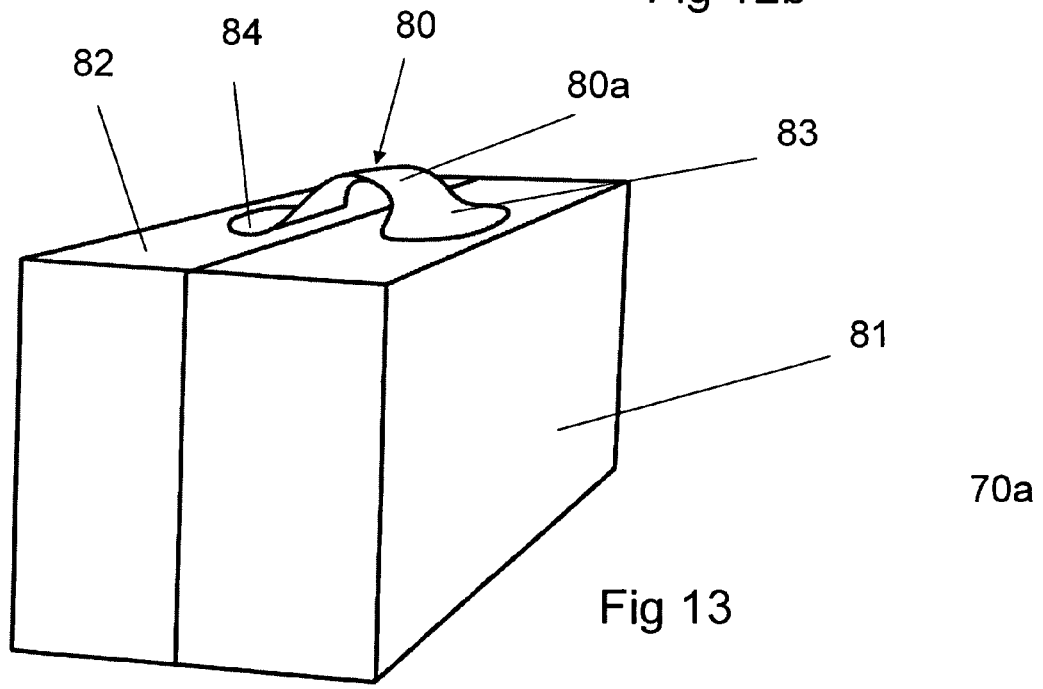
FIG. 13 shows a handling element connected to two secondary articles in the form of two packages.

FIG. 13 shows a handling element 80 connected to two secondary articles in the form of two packages 81 and 82.

The handling element is provided with two adhesion areas 83 and 84 and forms a sling with the engagement area 80a located between said adhesion areas 83, 84. The two adhesion areas 83, 84 of the handling element 80 may be connected to one and the same secondary article (or package). One or more of the packages may be of the kind adapted to be temporarily connected to each other as described above. The packages connected to the handling element may also be connected to each other at the bottom (or top) using a connecting element as described above. The manner of providing the electrical power to the electrically weakable adhesive of the adhesion areas 83, 84 may be accomplished by any manner discussed in detail above.

The invention claimed is:

1. A connecting element adapted to temporarily hold together a plurality of secondary articles, comprising
    a base member;
    a plurality of adhesion areas spaced apart on said base member, at least one of said adhesion areas adapted to hold a respective one of the secondary articles to said base member, each of said adhesion areas including a bonding layer comprising an electrically weakable adhesive; and
    an electric circuit at least partially on said base member and electrically connected to said adhesion areas and configured to selectively cause electrical current to flow through said electrically weakable adhesive of said adhesion areas and thereby release one or more of the secondary articles from said base member.

2. A connecting element according to claim 1, wherein said adhesion areas further comprise first and second electrically conductive active surfaces, said active surfaces being arranged at a distance from each other, said bonding layer being on at least a portion of both said first and second active surfaces and bridging the distance between said first and said second active surfaces, and said circuit being electrically connected to said first and second active surfaces.

3. A connecting element according to claim 2, wherein in each said adhesion area said first and second electrically conductive active surfaces are both arranged on one side of said base member and are on one side of said bonding layer and the other side of said bonding layer is configured to receive one of the secondary articles.

4. A connecting element according to claim 2, wherein in at least a plurality of said adhesion areas said first active surface substantially surrounds said second active surface.

5. A connecting element according to claim 1, wherein said electrical circuit connects said adhesion areas in parallel to each other.

6. A connecting element according to claim 1, wherein said electrical circuit comprises at least one switch for selectively causing electrical current to flow through said electrically weakable adhesive of said adhesion areas.

7. A connecting element according to claim 1, wherein said electrical circuit is configured to be connected to an external source of electric power.

8. A connecting element according to claim 1, further comprising an electrical power source carried on said base member and connected to said electrical circuit.

9. A connecting element according to claim 8, wherein said electrical power source comprises a printed or laminate battery.

10. A connecting element according to claim 1, wherein said first active surface is of a first material with a first electrode potential, and said second active surface is of a second material with a second electrode potential, and wherein the first electrode potential differs from the second electrode potential.

11. A connecting element according to claim 10, wherein said electrical circuit includes a switch.

12. A connecting element according to claim 1, wherein said electrical circuit further comprises an electromagnetic wave receiving antenna.

13. A connecting element according to claim 1, wherein said base member is formed of a non-conductive material.

14. A connecting element according to claim 1, wherein said base member is formed of paper or paper board.

15. A connecting element according to claim 1, wherein all of the adhesion areas are arranged on one side of said base member.

16. A connecting element according to claim 1, wherein at least one of said adhesion areas is arranged on one side of said base member and at least another one of said adhesion areas is arranged on the other side of said base member.

17. A connecting element according to claim 1, wherein said bonding layer further comprises a non-electrically weakable adhesive arranged as a layer on the electrically weakable adhesive and is configured to engage the secondary article, said non-electrically weakable adhesive being between the electrically weakable adhesive and the secondary article.

18. A connecting element adapted to temporarily hold together a plurality of packages, comprising
a non-conductive base member formed of paper or paper board and having a surface;
a plurality of adhesion areas on the surface of said base member, at least one of each of said adhesion areas adapted to hold a respective one of the packages to said base member, each said of said adhesion areas comprising first and second electrically conductive active surfaces, said active surfaces being arranged at a distance from each other and a bonding layer comprising an electrically weakable adhesive on at least a portion of both said first and second actives surfaces and bridging the distance between said first and said second active surfaces; and
an electrical circuit at least partially on the base member and electrically connected to said first and said second active surfaces of each of said adhesion areas to selectively cause current to flow through said electrically weakable adhesive of each of said adhesion areas and thereby release one or more of the packages from said base member.

19. A connecting element according to claim 18, wherein said electrical circuit comprises a first conductor joining each of said first electrically conductive active surfaces and a second conductor spaced from said first conductor and joining each of said second active surfaces.

* * * * *